United States Patent [19]

Teshima et al.

[11] Patent Number: 4,647,901

[45] Date of Patent: * Mar. 3, 1987

[54] DISPLAY UNIT OF SPEEDOMETER FOR AUTOMOBILE

[75] Inventors: Tohru Teshima, Yokohama; Chihiro Funaoka, Tokyo, both of Japan; Pierre H. Robert, Bougival, France

[73] Assignees: Regie Nationale des Usines Renault, Boulogne-Billancourt, France; Stanley Electric Co., Ltd., Tokyo, Japan

[*] Notice: The portion of the term of this patent subsequent to Mar. 3, 2004 has been disclaimed.

[21] Appl. No.: 484,505

[22] Filed: Apr. 13, 1983

[30] Foreign Application Priority Data

Apr. 20, 1982 [JP] Japan ................................. 57-64876

[51] Int. Cl.[4] .......................... B60Q 1/00; G08B 5/00
[52] U.S. Cl. ................................ 340/52 R; 340/52 F; 340/815.01
[58] Field of Search ................... 340/52 F, 52 R, 670, 340/62, 815.01, 753, 754, 709, 721, 722, 715; 324/115

[56] References Cited

U.S. PATENT DOCUMENTS 4,223,297 9/1980 Nomura et al. ...................... 340/670
4,251,769 2/1981 Ewert et al. ......................... 340/753

Primary Examiner—John W. Caldwell, Sr.
Assistant Examiner—Tyrone Queen
Attorney, Agent, or Firm—Oblon, Fisher, Spivak, McClelland & Maier

[57] ABSTRACT

A display unit of a speedometer meter for an automobile, wherein a desired car speed is determined and an actual car speed is measured and signals corresponding thereto are applied to a comparing circuit and bar graph decoders. The comparing circuit compares the amplitude of the signals corresponding to desired car speed and actual car speed, and the bar graph decoders, after decoding the signals into a format compatible with a bar graph display, transmits the signals to an EX-OR circuit and an OR circuit. A selector circuit controlled by the output of a comparing circuit selects either the output of the EX-OR circuit or that of the OR circuit for driving plural segments of a bar graph display which accordingly displays both desired car speed and actual car speed either by driving selected display signals corresponding thereto or by driving display segments corresponding to a maximum value thereof and by inhibiting the driving of at least one display segment common to both desired car speed and actual car speed.

1 Claim, 8 Drawing Figures

DISPLAY UNIT OF SPEEDOMETER FOR AUTOMOBILE

BACKGROUND OF THE INVENTION

1. Field of the Invention

This invention relates to a display unit for a speedometer of an automobile.

2. Description of the Prior Art

The conventional automotive speedometers have been devised variously by adopting many kinds of display construction. In many of such speedometers, however, an index for indicating a set speed is incorporated as a separate construction member in a display device and this gives rise to a problem preventing the construction from being simplified.

SUMMARY OF THE INVENTION

Accordingly, one of the objects of this invention is to provide a novel display unit of a speedometer for an automobile, which is low in price and easy for a driver to watch, wherein the display unit includes a liquid-crystal bar graph display for displaying car speed and an index indicating a desired set car speed, and a driving circuit for driving the liquid crystal bar graph display.

Another object of this invention is to provide a display unit of a speedometer for an automobile in which a number of segments necessary to construct the bar graph are formed in arbitrary shape and are arranged adjacently in sequence, while the aforesaid car speed and index are displayed by the display means by selective activation of the segments so as to enable a driver to clearly distinguish the car speed and the index on one and the same display device.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
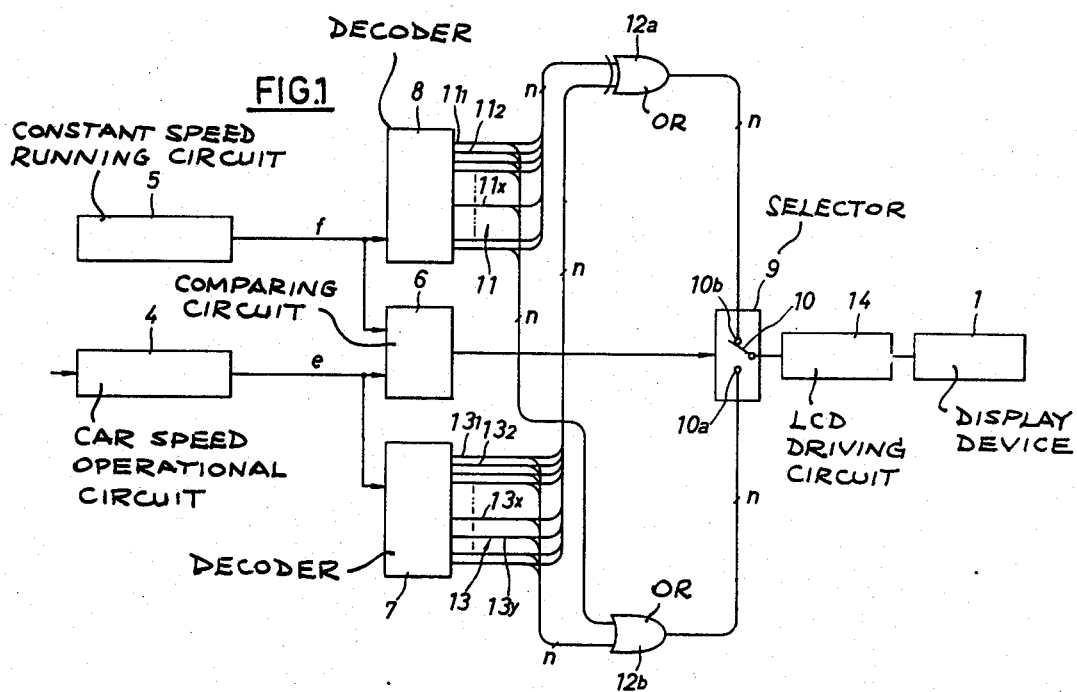
FIG. 1 is a block circuit diagram showing the whole of one embodiment of the index display unit of a speedometer for an automobile according to this invention.
Figure 2:
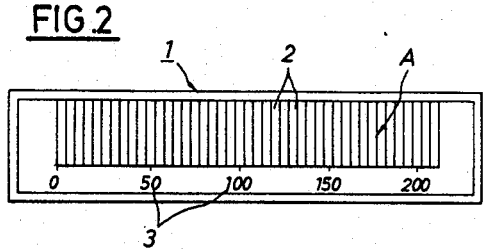
FIG. 2 is a front view of an example of the display device or bar graph construction according to the invention.

Referring now to the drawings, wherein like reference numerals designate identical or corresponding parts throughout the several views, and more particularly to FIGS. 1 and 2 thereof, numeral 1 designates a display device which is formed including a bar graph display including plural segments 2 using liquid crystal display technology. Namely, as shown, n-piece segments 2 the same in size formed of long and narrow plates are arranged and connected together, and arrangement is made so as to enable the display device 1 to display desired car speeds with individual of the segments 2 being used as a basic unit, such as 1 km/h or 2 km/h. Numeral 3 designates scales shown on the necessary position of the display device 1.

Accordingly, the display device 1 can display proper numerical values as a result of changes in condition of light and darkness, transparency and turbidity, etc. which are caused by the changes of optical properties of liquid crystal associated with the plural activated segments 2 in a respective field on which voltage is impressed, such that segments having voltages impressed thereon are optically different relative to other segments in the field on which no voltage is impressed. And also, the display range may make the necessary construction easy to watch for a driver in the daytime and nighttime with transmitted light, reflected light, etc. by display means under DS (dynamic scattering) system, TN (twisted nematic) system, ECB (electrically controlled birefringence) system, PC (phase change) system, etc. according to the difference in the mechanism transforming the optical changes in the condition of the liquid crystal caused by the impressed electric signals.

And further, as to the display device 1, each segment 2 can freely be arranged, for example in an up-to-down direction, or in a right-to-left direction as shown, and can be constructed with desired shapes without being limiting to the construction shown, while the display device 1 on the whole can be formed in a circular arc, circle, circular ring etc. as desired according to the shapes of the segments.

Numeral 4 designates a car speed operational circuit which is arranged so as to make it possible to input car speed pulse signals according to speeds of automobile (car speeds) and to make it possible to transmit signals, by computing car speeds as the distance per average unit time (km/h), to next stage continuously or at intervals of a desired set time. Numeral 5 designates a constant speed running circuit, to which a driver can set freely any desired car speed, and transmit the output signals corresponding to the set speed for making it possible to perform constant speed running by conventionally known means, and also can display the desired speed by optical functioning of the corresponding desired segment 2 as an index in the display device 1.

Numeral 6 designates a comparing circuit which compares the size of set speed signals f with the size of car speed signals e sent by the aforesaid both circuits 4 and 5 respectively and which transmits output signals controlling a selector 9 that changes over output signals for the two sets of bar graph decoders 7 and 8.

Namely, concerning the output signals of the comparing circuit 6;

(i) When f>e, the circuit 6 changes a switch 10 of the selector 9 kept at a high area over to a terminal 10a communicating with the output side of OR circuit 12b.

(ii) When f≦e, the circuit 6 changes the switch 10 of the selector 9 kept at a low area over to a terminal 10a communicating with the output side of EX-OR circuit 12a.

The bar graph decoder 8 mentioned above is provided with connecting wires 11 corresponding to n-piece segments 2 on its output side, is connected with a terminal 10b of the selector 9 mentioned above through the EX-OR circuit 12a, and is arranged so as to transmit signals only through a connecting wire 11x corresponding to the maximum value of set speed signals transmitted by the constant speed running circuit 5.

The bar graph decoder 7 mentioned above is provided with connecting wires 13 corresponding respectively to the plural segments 2 on its output side, is connected with a terminal 10a of the selector 9 mentioned above through the OR circuit 12b, and is arranged so as to transmit signals through all connecting wires, $13_1, 13_2, \ldots 13_y$, corresponding to car speed signals transmitted by the car speed operational circuit 9.

Further, construction is made so that the output signals from both bar graph decoders 7 and 8 can be inputted in the gates of OR circuits 12b and EX-OR circuit 12a respectively.

Numeral 14 is a liquid-crystal driving circuit connected with the selector 9, and is arranged so as to perform liquid-crystal display by giving optical changes to the liquid crystal of segments 2 by the connection with each segment 2 of the display device 1 mentioned above.

Based on the construction mentioned above, description is made on the action of this invention.

The car speed pulse signals of intake manifold detected during the running of automobile are applied constantly, at the values according to the changes of car speed, to the car speed operational circuit 4, and are computed in the circuit 4 to become the output signals e, which are applied to the comparing circuit 6 and at the same time are inputted in the bar graph decoder 7. The output signal f corresponding to the set speed transmitted by the constant speed running circuit 5 is inputted in the comparing circuit 6 and the bar graph decoder 8 respectively.

Figure 3:
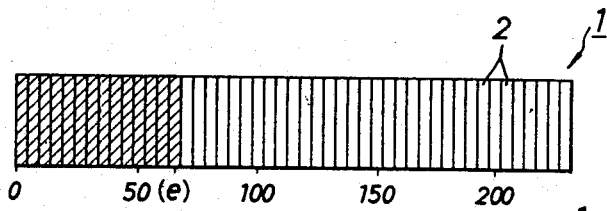
FIGS. 3(a), 3(b) and 3(c) and FIGS. 4(a), 4(b) and 4(c) are explanative views showing respectively two examples of car speed and set car speed shown on the display device, wherein for each segment of the display device, oblique line portions show a functioning state and lineless portions show a non-functioning state.
Figure 3:
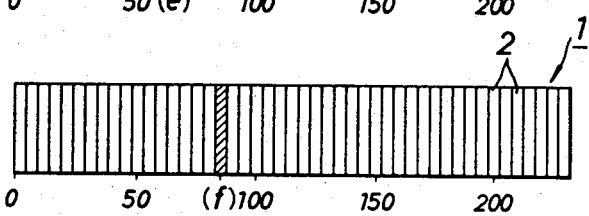
Figure 3:
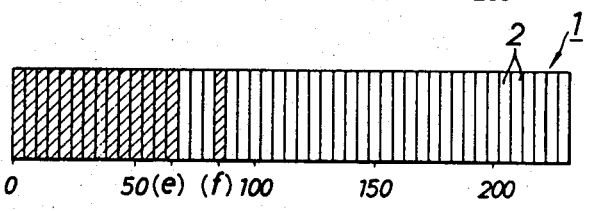

In case the output signals of set speed f are larger than the output signals of car speed e, the selector 9 changes its switch 10 over the terminal 10a, and therefore the car speed signals, transmitted through the connecting wires $13_1, 13_2 \ldots 13_y$ of the bar graph decoder 7, are applied to a liquid-crystal driving circuit 14 through the selector 9 via the OR circuit 12b, and can be displayed in the state of oblique line portion in FIG. 3(a) by giving optical changes to the corresponding segments 2 of the display device 1 which are made to function in the field on which desired voltage is impressed.

And, as the signals corresponding to the set speed transmitted by the bar graph decoder 7 are transmitted only through a connecting wire $11_x$ corresponding to the maximum value, the signals are applied to the liquid-crystal driving 14 through the selector 9 via OR circuit 12b, and can be displayed in the state of FIG. 3(b) by giving optical changes to a corresponding segment 2 of the display device 1 which is made to function in the field on which voltage is impressed. However, the display device 1 being one piece, the both signals are synthesized in the display device 1 and are displayed in the state of oblique line portion in FIG. 3(c).

When the actual car speed is slower than said car speed, the switch 10 of the selector 9 is positioned in 10a. Accordingly, the EX-OR circuit 12a is open and signals are supplied only to the EX-OR circuit 12a. For this reason, output of the decoder 7 is displayed as in FIG. 3a and the output of the decoder 8 is displayed as in FIG. 3b. As a result, the display as shown in FIG. 3c is obtained. That is, the OR circuit 12b has the function to display the output of the decoders 7, and 8 as its normal function. When the actual car speed is faster than the said car speed, the switch 10 of the selector 9 is positioned at the position 10b. The EX-OR circuit 12a prevents only the corresponding signal of the decoder 7 and 8 and performs the function of blocking the transmitter of the display signal. It is additionally clear that the car speed pulse signal is obtained by the speed sensor attached to the automobile.

Figure 4:
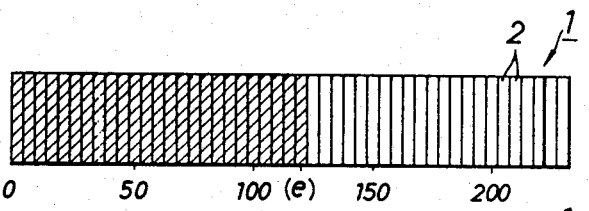
Figure 4:
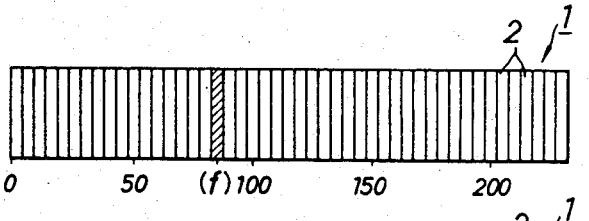
Figure 4:
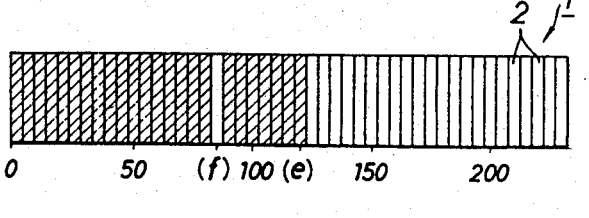

Next, in case the output signals f corresponding to the set speed are equal to or below the output signals e of car speed, the selector 9 changes its switch 10 over to the terminal 10b influenced by the output signals of the comparing circuit 6; therefore if the both signals from both bar graph decoders 7 and 8 are applied individually to the display device 1 as mentioned above, the both signals result in giving optical changes to corresponding segments 2, which are made to function, and are displayed respectively in the state of oblique line portions of FIGS. 4(a) and (b).

However, practically both signals are transmitted through the EX-OR circuit 12a and the signals passing through the corresponding connecting wires $11_x$ and $11_y$ agree with each other, and therefore no output signals are obtainable. Consequently, only the segments 2 corresponding to said portions are displayed in the state of not being influenced by the impressed voltage as shown in FIG. 4(c) in the display device 1.

Therefore, the segments displaying the index of set speed according to the running state of the automobile are displayed in two ways; one being the case where the segments displaying the index of set speed are different from the segments displaying the car speed, and the other being the case where the both segments are the same. If the both segments are different from each other, the both segments are displayed, with optical changes being given to them. If the both segments are the same, optical changes are not given only to the segments which agree with each other and the other segments of car speed are displayed in the state where optical changes are given to them.

In case the car speed agrees with the set car speed, and in case the set car speed is larger by the segment corresponding to one scale than the car speed, the display, by which the car speed is distinguishable from the set car speed, is not obtainable. However, the above shows the case where the running is made in the state equal to or closest to the set car speed, and there is no problem causing any obstacle in the practical use.

Thus, description is made on one embodiment of this invention, but this invention is not limited to the embodiment and, as a matter of course, the technical construction involved in this invention can be modified or changed according to the necessity.

In particular, the embodiment described above may be constructed by changing reversely the driving condition of each segment 2 in the display device 1.

According to this invention, as described above, two displaying items of car speed and index corresponding to set car speed are incorporated as one body in the display device provided with one bar graph using liquid crystal or other luminous means. This makes it possible to make the display device small in size by saving the displaying space and makes it possible to use one driving circuit in common for two displaying items resulting in decreasing the cost of production; and moreover a driver can obtain two kinds of information on car speed and set car speed by watching only one display device, so that this invention has an advantage of securing the safety of driving because the driver has only to release his eyes for a very short time from the front during the running.

And also, the driver can drive the car, comparing car speeds with an index of set car speed during the running; and this enables the driver to get the effect of driving the car constantly at proper speed by shifting the gear in order to make the car speed close to the set car speed.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A display unit of a speedometer for an automobile, comprising:
   a constant speed running circuit capable of producing output signals indicative of a desired car speed;
   an actual car speed operational circuit capable of producing output signals indicative of actual car speed;
   a comparing circuit for comparing the amplitudes of said output signals of said constant speed running operational circuit and said actual car speed operational circuit;
   bar graph decoders receiving said output signals from said constant speed running operational circuit and said actual car speed operational circuit;
   an EX-OR circuit having inputs coupled to respective bar graph decoders and having an output;
   an OR circuit having inputs coupled to respective bar graph decoders and having an output;
   selector means coupled to said output of said EX-OR circuit and said output of said OR circuit and controlled by an output of said comparing means for connecting a selected of said outputs of said EX-OR and OR circuits to an output of said selector means; and
   a bar graph display comprising plural display segments and a driving circuit for activating selected of said segments, said driving circuit coupled to the output of said selector means such that said display segments are selectively driven by the output of said EX-OR circuit or the output of said OR circuit;
   whereby said display device displays said desired car speed and actual car speed in two modes, including a first mode in which said display device displays desired car speed and actual car speed by selectively driving display segments corresponding thereto and a second mode in which said display device displays actual car speed and desired car speed by driving selected display segments corresponding to a maximum value of said actual car speed and said desired car speed and indicates at least one segment common to both said actual car speed and desired car speed by inhibiting driving of said at least one display segment.

* * * * *